(12) United States Patent
Higuchi

(10) Patent No.: US 11,217,461 B2
(45) Date of Patent: Jan. 4, 2022

(54) SUBSTRATE PROCESSING DEVICE

(71) Applicant: SCREEN Holdings Co., Ltd., Kyoto (JP)

(72) Inventor: Ayumi Higuchi, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 90 days.

(21) Appl. No.: 16/323,537

(22) PCT Filed: Jul. 27, 2017

(86) PCT No.: PCT/JP2017/027228
§ 371 (c)(1),
(2) Date: Feb. 6, 2019

(87) PCT Pub. No.: WO2018/061445
PCT Pub. Date: Apr. 5, 2018

(65) Prior Publication Data
US 2019/0198356 A1   Jun. 27, 2019

(30) Foreign Application Priority Data
Sep. 30, 2016  (JP) .............................. JP2016-193249

(51) Int. Cl.
*H01L 21/67* (2006.01)
*H01L 21/3213* (2006.01)
(Continued)

(52) U.S. Cl.
CPC ........ *H01L 21/6708* (2013.01); *H01L 21/304* (2013.01); *H01L 21/306* (2013.01); *H01L 21/32134* (2013.01); *H01L 21/67017* (2013.01)

(58) Field of Classification Search
None
See application file for complete search history.

(56) References Cited

U.S. PATENT DOCUMENTS 6,117,244 A * 9/2000 Bang .................... C23C 16/4401
118/715
6,841,031 B2 * 1/2005 Iwata ...................... C03C 15/00
118/719
(Continued)

FOREIGN PATENT DOCUMENTS

JP    S61-149485 A    7/1986
JP    H07-130694 A    5/1995
(Continued)

OTHER PUBLICATIONS

Machine Generated English Translation of the description of JP61-149485. Published Jul. 8, 1986 (Year: 1986).*
(Continued)

*Primary Examiner* — Sylvia Macarthur
(74) *Attorney, Agent, or Firm* — Ostrolenk Faber LLP

(57) ABSTRACT

An object is to quickly regenerate metal ion removal capability of a substrate processing device. To achieve the object, a substrate processing device includes a processing unit, a supply tank and a collection tank. The processing unit performs etching processing on a substrate by using a treatment solution from a first circulation path. The used treatment solution is guided to the collection tank, and circulates in a second circulation path. The second circulation path includes a first partial pipe and a second partial pipe, and a metal removal coating including metal capturing groups for removing metal ions in the treatment solution is applied to an inner wall of the first partial pipe. An acid-based chemical solution is supplied to the first partial pipe from the acid-based chemical solution supply unit, so that metal adsorption force of the metal capturing groups is regenerated.

6 Claims, 4 Drawing Sheets

(51) Int. Cl.
*H01L 21/306* (2006.01)
*H01L 21/304* (2006.01)

(56) References Cited

U.S. PATENT DOCUMENTS

| | | | | |
|---|---|---|---|---|
| 2006/0205325 | A1* | 9/2006 | Abe | C23F 1/46 |
| | | | | 451/36 |
| 2009/0229641 | A1* | 9/2009 | Yoshida | B08B 3/14 |
| | | | | 134/107 |
| 2013/0048215 | A1* | 2/2013 | Higashi | H01L 21/67086 |
| | | | | 156/345.15 |
| 2016/0233082 | A1* | 8/2016 | Yano | H01L 21/67086 |
| 2018/0090340 | A1* | 3/2018 | Sugioka | H01L 21/67253 |
| 2019/0198356 | A1* | 6/2019 | Higuchi | H01L 21/32134 |

FOREIGN PATENT DOCUMENTS

| | | |
|---|---|---|
| JP | H08-008223 A | 1/1996 |
| JP | H09-167752 A | 6/1997 |
| JP | 2002-270568 A | 9/2002 |
| JP | 2008-252049 A | 10/2008 |
| JP | 2009-218405 A | 9/2009 |
| JP | 2016-192473 A | 11/2016 |
| KR | 2007-0111982 A | 11/2007 |

OTHER PUBLICATIONS

Notification of Reason for Refusal dated May 8, 2020 in corresponding Korean Patent Application No. 10-2019-7002795 with English translation obtained from the JPO.
International Preliminary Report on Patentability dated Apr. 11, 2019 containing the Written Opinion of the International Searching Authority in corresponding International Application No. PCT/JP2017/027228 with English translation.
International Search Report dated Oct. 24, 2017 in corresponding PCT International Application No. PCT/JP2017/027228.
Written Opinion dated Oct. 24, 2017 in corresponding PCT International Application No. PCIT/JP2017/027228.
Office Action dated Jun. 6, 2018 in corresponding Taiwanese Patent Application No. 106125524, along with a partial English translation based on a Japanese translation.
Decision of Refusal dated May 11, 2021 in counterpart Japanese Patent Application No. 2016-193249 with English translation obtained from Global Dossier.

* cited by examiner

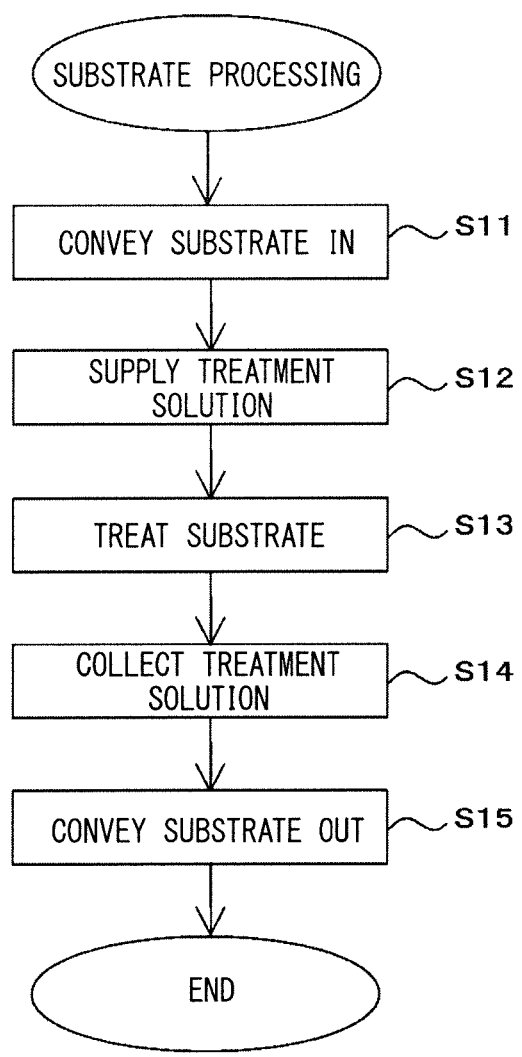
F I G. 3

SUBSTRATE PROCESSING DEVICE

CROSS-REFERENCE TO RELATED APPLICATIONS

The present application is a 35 U.S.C. §§ 371 national phase conversion of PCT/JP2017/027228, filed Jul. 27, 2017, which claims priority to Japanese Patent Application No. 2016-193249, filed Sep. 30, 2016, the contents of which are incorporated herein by reference. The PCT International Application was published in the Japanese language.

TECHNICAL FIELD

The present invention relates to a substrate processing technique which can efficiently remove metal impurities from a cleaning solution of a substrate.

BACKGROUND ART

Conventionally, processing of supplying a treatment solution to a substrate is used to treat a substrate for various uses in semiconductor substrates and glass substrates. A dense circuit pattern is formed on a substrate, and therefore a filter which removes particles is provided in a flow path which supplies a treatment solution to the substrate. The particle removal filter is exchanged or regenerated on a regular basis.

For example, Patent Document 1 discloses a substrate processing device which includes a filter which effectively removes metal impurities from a treatment solution of a semiconductor substrate.

PRIOR ART DOCUMENTS

Patent Documents

Patent Document 1: Japanese Patent Application No. 8-8223 (1996)

SUMMARY

Problem to be Solved by the Invention

The substrate processing device according to Patent Document 1 includes the filter which removes metal impurities. The filter can regenerate filter capability deteriorated due to a change over time by causing a cleaning solution to pass the filter, yet a special measure for reducing this regeneration work has not been taken.

The present invention has been made in light of the above problem, and an object of the present invention is to provide a substrate processing device which can quickly regenerate metal ion removal capability.

Means to Solve the Problem

An invention according to a first aspect is directed to a substrate processing device including: a supply tank which stores a treatment solution; a processing unit which supplies the treatment solution in the supply tank to a substrate and performs etching processing on the substrate; a collection path which guides to a collection tank the treatment solution supplied for the etching processing; a treatment solution circulation path which goes from the collection tank and returns to the collection tank; and a pump which circulates the treatment solution in the collection tank via the treatment solution circulation path, in which a coating is applied to an inner wall of a pipe, the coating including a metal capturing group which removes a metal ion in the treatment solution, and the inner wall being at least part of the treatment solution circulation path, the substrate processing device further including an acid-based chemical solution supply unit which supplies an acid-based chemical solution to the pipe to which the coating has been applied, and removes the metal ion from the metal capturing group.

According to the substrate processing device according to the first aspect, the coating including a metal capturing group which removes a metal ion in the treatment solution is applied to an inner wall of a pipe which is at least part of the treatment solution circulation path. Consequently, the acid-based chemical solution supply unit can supply the acid-based chemical solution into the pipe at a high flow velocity, and increase solution exchange efficiency. Consequently, it is possible to remove metal ions from metal capturing groups and quickly regenerate metal ion removal capability of the metal capturing groups.

An invention according to a second aspect is directed to a substrate processing device according to the first aspect, in which a metal densitometer is interposed in the treatment solution circulation path, the substrate treatment apparatus further including a control unit which, when a metal ion concentration in the treatment solution detected by the metal densitometer satisfies a preset condition, causes the acid-based chemical solution supply unit to supply the acid-based chemical solution into the pipe.

An invention according to a third aspect is directed to the substrate processing device according to the second aspect, in which the metal densitometer includes at least one of a spectrometer, a refractometer and a conductivity meter.

An invention according to a fourth aspect is directed to the substrate processing device according to the first aspect, in which the metal capturing group includes a material containing a chelate substituent, an ion exchange group or both of the chelate substituent and the ion exchange group.

An invention according to a fifth aspect is directed to the substrate processing device according to the first aspect, further including a particle removal filter on a downstream side of the coating in the treatment solution circulation path.

The substrate processing device according to the fifth aspect can prevent particles from further flowing to the downstream.

An invention according to a sixth aspect is directed to the substrate processing device according to the first aspect, in which the pipe whose inner wall has been applied the coating is formed by a combination of a plurality of unit pipes which are coupleable to each other.

The substrate processing device according to the sixth aspect can easily secure a coating of a necessary solution contact area including the metal capturing group.

Effect of the Invention

According to the present invention, a substrate processing device which performs etching processing can quickly perform processing of regenerating metal capturing groups for removing metal ions from a collected treatment solution. Consequently, it is possible to reduce downtime of the substrate processing device.

BRIEF DESCRIPTION OF DRAWINGS

FIG. 3 shows a flow of a basic operation of the substrate processing device.

DESCRIPTION OF EMBODIMENT

Figure 1:
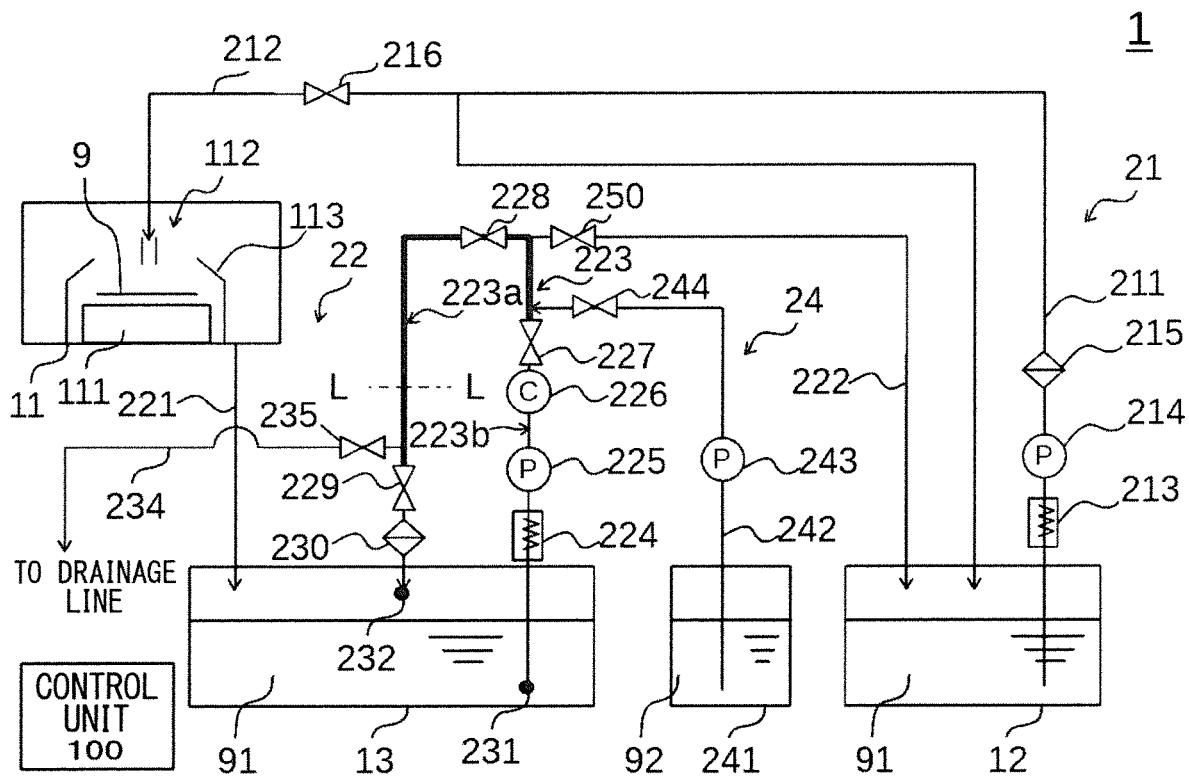
FIG. 1 shows a schematic configuration of a substrate processing device.

FIG. 1 shows a schematic configuration of a substrate processing device 1 according to one embodiment of the present invention. The substrate processing device 1 supplies an etching solution which is a treatment solution to a substrate 9, and performs etching processing on a surface of the substrate 9. The substrate processing device 1 includes a processing unit 11, a supply tank 12 which stores a treatment solution 91, and a collection tank 13 which stores the used treatment solution 91. The used treatment solution 91 is returned from the collection tank 13 to the supply tank 12.

In the following description, a flow path system in which the treatment solution 91 prior to use flows between the supply tank 12 and the processing unit 11 will be referred to as a "first flow path system 21". A flow path system in which the used treatment solution 91 flows between the processing unit 11 and the supply tank 12 will be referred to as a "second flow path system 22". The collection tank 13 is included in the second flow path system 22.

The processing unit 11 includes a rotation unit 111 which rotates the substrate 9 in a horizontal state, a supply unit 112 which supplies the treatment solution 91 to an upper surface of the substrate 9, and a solution reception unit 113 which receives the treatment solution 91 scattered from the substrate 9. The treatment solution 91 containing metal ions of a high concentration received by the solution reception unit 113 is guided to the collection tank 13. The treatment solution 91 immediately after use contains metal ions at an order of ppm, for example. Another structure may be adopted as a structure of the processing unit 11. In the present embodiment, the processing unit 11 is a single wafer type, yet may be a batch type. Various etching solutions may be used as the treatment solution 91. The present embodiment is suitable for use of expensive etching solutions having good etch selectivity with respect to titanium, tungsten, other metals and nitrides of these metals, and etching solutions for back end of line (BEOL).

The first flow path system 21 includes a first circulation path 211 and a supply path 212. A heater 213, a pump 214 and a particle removal filter 215 are provided on the first circulation path 211. The pump 214 circulates the treatment solution 91 in the first circulation path 211 via the supply tank 12. That is, the treatment solution 91 circulates by going from the supply tank 12 and returning to the supply tank 12 via the first circulation path 211. The particle removal filter 215 removes particles contained in the treatment solution 91.

The heater 213 keeps a constant temperature of the treatment solution 91 existing in the first circulation path 211 and the supply tank 12. More accurately, the heater 213, and an unillustrated thermometer and temperature control unit function as a temperature adjustment unit, and the temperature control unit controls the heater 213 based on the temperature of the treatment solution 91 obtained by the thermometer, so that the temperature of the treatment solution 91 in the first circulation path 211 is adjusted at a constant temperature.

The supply path 212 is provided with a valve 216. The first circulation path 211 extends to near the processing unit 11, and, when the valve 216 opens, the supply unit 112 of the processing unit 11 supplies onto the substrate 9 the treatment solution 91 whose temperature has been adjusted.

The second flow path system 22 includes a collection path 221 which guides the treatment solution 91 from the processing unit 11 to the collection tank 13, a replenishment path 222 which guides the treatment solution 91 from the collection tank 13 to the supply tank 12, and a second circulation path 223. In the present embodiment, the replenishment path 222 is branched from the second circulation path 223. The replenishment path 222 may directly guide the treatment solution 91 from the collection tank 13 to the supply tank 12. Furthermore, part of the second circulation path 223 may be understood to also function as the replenishment path 222. A valve 250 is interposed on the replenishment path 222.

The valve 250 and a valve 228 described later operate in a complementary manner to circulate the treatment solution 91 in the second circulation path 223 toward the collection tank 13 and supply the treatment solution 91 toward the replenishment path 222. That is, the valve 250 and the valve 228 function as selector valves of flow paths in which the treatment solution 91 flows.

A heater 224, a pump 225, a metal densitometer 226, valves 227 to 229 and a particle removal filter 230 are provided on the second circulation path 223.

The second circulation path 223 is a pipe which connects a solution suction port 231 which is opened in the treatment solution 91 stored in the collection tank 13, and a discharge port 232 which is opened in the collection tank 13, and includes a first partial pipe 223a from the valve 227 to the valve 229, and a second partial pipe 223b other than the first partial pipe 223a.

The pump 225 circulates the treatment solution 91 in the second circulation path 223 via the collection tank 13. That is, the treatment solution 91 circulates by going from the collection tank 13 and returning to the collection tank 13 via the second circulation path 223.

The heater 224 maintains a constant temperature of the treatment solution 91 existing in the second circulation path 223 and the collection tank 13. More accurately, the heater 224, and an unillustrated thermometer and temperature control unit function as a temperature adjustment unit, and the temperature control unit controls the heater 224 based on the temperature of the treatment solution 91 obtained by the thermometer, so that the temperature of the treatment solution 91 in the second circulation path 223 is adjusted at a constant temperature.

The metal densitometer 226 obtains a concentration of metal ions in the treatment solution 91 in the second circulation path 223. The concentration of the metal ions will be referred to as a "metal concentration" below. More specifically, the metal densitometer 226 includes at least one of a spectrometer, a refractometer and a conductivity meter. Preferably, the metal densitometer 226 includes the spectrometer. In addition, the metal densitometer 226 may be provided outside the second circulation path 223, and indirectly obtain the concentration of the metal ions in the treatment solution 91 in the second circulation path 223. For example, the metal densitometer 226 may be provided in the collection tank 13.

Figure 2:
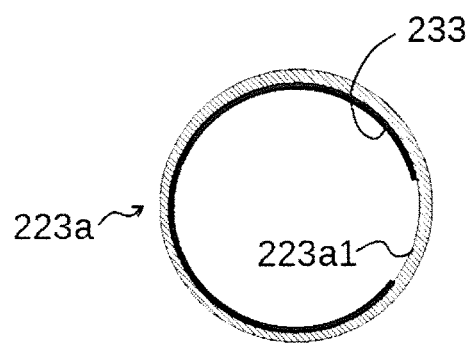
FIG. 2 is a cross-sectional view of a first partial pipe.

Next, a structure of the first partial pipe 223a will be described. FIG. 2 is a cross-sectional view of the first partial pipe 223a taken along line L-L portion in FIG. 1. As shown in FIG. 2, a metal removal coating 233 polymerized with metal capturing groups is applied to a substantially entire circumference of an inner wall 223a1 of the first partial pipe 223a. The metal capturing groups of the metal removal coating 233 remove the metal ions, so-called dissolved metals in the treatment solution 91 flowing in the first partial pipe 223a. The metal ions to be removed are mainly metal ions dissolved in the treatment solution 91 from the surface of the substrate 9 by etching processing. In addition, the metal may contain arsenic having a substantially metal property. The metal removal coating 233 includes a material containing a chelate substituent or an ion exchange group. More specifically, a chelate resin, an ion exchange resin or a combination of a plurality of types of resins is used for the metal removal coating 233.

In addition, FIG. 2 shows that the metal removal coating 233 partially covers the inner wall of the first partial pipe 223a in a circumferential direction, yet the metal removal coating 233 may completely cover the inner wall 223a1 of the first partial pipe 223a in the circumferential direction. The metal removal coating 233 is not applied to an inner wall of the second partial pipe 223b, yet may be applied thereto. Furthermore, the metal removal coating 233 may be applied to an inner wall of the collection tank 13.

Back to FIG. 1, a branch pipe 234 is branched from a vicinity of a downstream end portion of the first partial pipe 223a. The branch pipe 234 is connected to a drainage line. A valve 235 is interposed in the branch pipe 234. The valve 235 and the valve 229 on the second circulation path 223 open and close in a complementary manner. That is, when the valve 235 is opened, the valve 229 is closed, and the treatment solution 91 in the second circulation path 223 is supplied toward the branch pipe 234. On the other hand, when the valve 229 is opened, the valve 235 is closed, and the treatment solution 91 in the second circulation path 223 is fed toward the downstream. Thus, a pair of the valve 229 and the valve 235 function as selector valves of the treatment solution 91.

The substrate processing device 1 includes an acid-based chemical solution supply unit 24. The acid-based chemical solution supply unit 24 includes a chemical tank 241, an acid-based chemical solution supply path 242, a pump 243 and a valve 244.

The chemical tank 241 stores an acid-based chemical solution 92. The acid-based chemical solution supply path 242 connects the chemical tank 241 and the second circulation path 223 of the second flow path system 22. The acid-based chemical solution supply path 242 communicates with the second circulation path 223 near a start end of the first partial pipe 223a (a position between the valve 227 and the valve 228).

The pump 243 is interposed in the acid-based chemical solution supply unit 24, and feeds the acid-based chemical solution 92 in the chemical tank 241 toward the acid-based chemical solution supply path 242. The valve 244 and the valve 227 are opened and closed in a complementary manner. That is, when the valve 244 is opened, the valve 227 is closed, and the acid-based chemical solution 92 in the acid-based chemical solution supply path 242 is supplied toward the second circulation path 223. On the other hand, when the valve 227 is opened, the valve 244 is closed, and the treatment solution 91 in the second circulation path 223 is fed toward the downstream. Thus, a pair of the valve 227 and the valve 244 function as selector valves.

For example, one of hydrochloric acid, sulfuric acid, hydrofluoric acid, phosphoric acid and nitric acid is used as the acid-based chemical solution 92. When the acid-based chemical solution 92 is supplied to the first partial pipe 223a, the metal ions captured by the metal capturing groups (FIG. 2) on the inner wall of the first partial pipe 223a are removed. Thus, the metal capturing groups are regenerated, and an increase in an operational life of the metal capturing groups can be realized. The acid-based chemical solution 92 having passed the first partial pipe 223a is drained to the drainage line via the branch pipe 234.

A control unit 100 is a general computer system which includes a CPU which performs various types of computation processing, a ROM which stores a basic program and a RAM which stores various pieces of information, and exchanges electric signals with the rotation unit 111 and the supply unit 112 of the above processing unit 11, the heater 213, the pump 214 and the valve 216 of the first flow path system 21, the heater 224, the pump 225, the metal densitometer 226 and the valves 227, 228, 229, 235 and 250 of the second flow path system 22, and the pump 243 and the valve 244 of the acid-based chemical solution supply unit 24 to control them.

Next, a basic operation of the substrate processing device 1 will be described with reference to FIG. 3. First, the substrate 9 is conveyed in the processing unit 11 by a convey robot, and is placed on the rotation unit 111 (step S11). The substrate 9 is held by the rotation unit 111 and rotates. The supply tank 12 supplies the treatment solution 91 to the processing unit 11 via the supply path 212, and a nozzle located above the substrate 9 supplies the treatment solution 91 to the upper surface of the substrate 9 (step S12). Thus, etching processing is performed on the upper surface of the substrate 9 (step S13). The treatment solution 91 scatters from the substrate 9, is received by the solution reception unit 113 and is collected to the collection tank 13 via the collection path 221 (step S14). Steps S12 to S14 are performed in substantially parallel to each other.

Another processing such as cleaning is performed on the substrate 9 if necessary, and rotation of the substrate 9 is stopped. In addition, another processing may also be performed prior to the etching processing. The processed substrate 9 is conveyed out from the processing unit 11 by the convey robot (step S15).

Actually, a plurality of processing units 11 are connected to the first circulation path 211 and, when the corresponding valve 216 is opened, the treatment solution 91 is supplied to each processing unit 11. A plurality of processing units 11 are connected to the one collection tank 13, and the used treatment solution 91 from a plurality of processing units 11 is collected to the collection tank 13.

Figure 4:
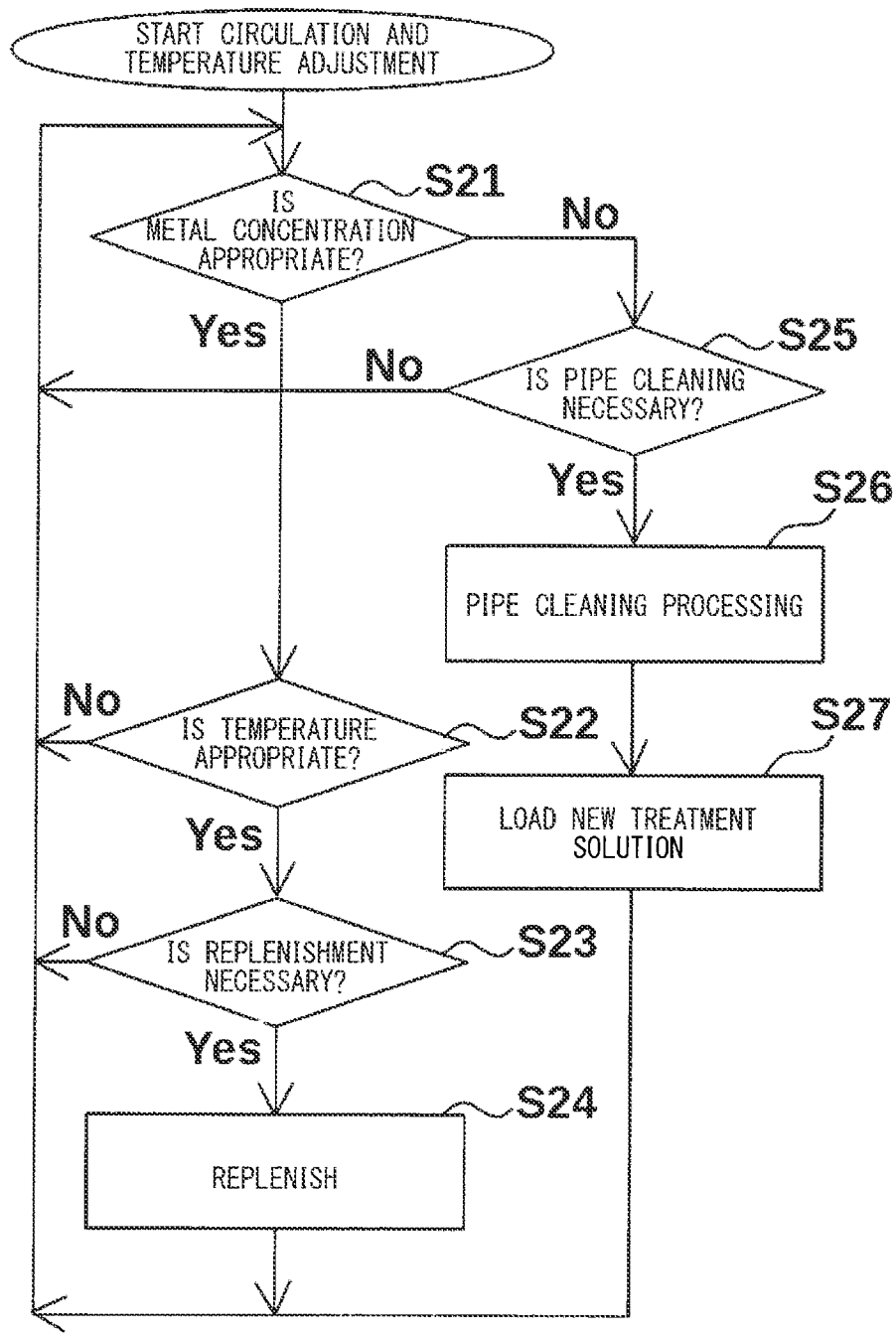
FIG. 4 shows a flow of circulation of a treatment solution.

FIG. 4 shows a flow of circulation and temperature control of the treatment solution 91 in the second circulation path 223. Processing in FIG. 4 is performed in parallel to circulation of the treatment solution 91. Although not shown in FIG. 4, as described above, during a process of circulation of the treatment solution 91, a process of adjusting the temperature of the treatment solution 91 in the second circulation path 223 and a process of removing the metal ions in the treatment solution 91 flowing in the second circulation path 223 are performed in parallel to each other.

The metal densitometer 226 repeatedly measures the metal concentration of the treatment solution 91 in the second circulation path 223 (step S21), and the unillustrated thermometer also repeatedly measures the temperature of the treatment solution 91 in the second circulation path 223 (step S22). The obtained metal concentration and temperature are inputted to the control unit 100 shown in FIG. 1. Immediately after the treatment solution 91 is collected from the processing unit 11, the temperature of the treatment solution 91 in the collection tank 13 is low and the metal concentration is also high in some cases. In this regard, while removal capability of the metal removal coating 233 does not lower, the metal concentration does not exceed a predetermined filter threshold (a metal concentration referred to determine whether pipe cleaning described below is necessary) (step S21). In more detail, in step S21, the control unit 100 determines whether the metal concentration of the treatment solution 91 is lower than a predetermined replenishment threshold to determine whether the treatment solution 91 in the collection tank 13 is suitable for replenishment to the supply tank 12. In step S22, the control unit 100 determines whether the treatment solution 91 in the collection tank 13 is suitable for replenishment to the supply tank 12 based on the temperature of the treatment solution 91.

The control unit 100 opens the valve 227 and closes the valve 244, opens the valve 228 and closes the valve 250, and opens the valve 229 and closes the valve 235, and the treatment solution 91 circulates in the second circulation path 223. Then, the heater 224 makes the temperature of the treatment solution 91 reach a predetermined target temperature, and the metal concentration of the treatment solution 91 is lowered by the metal removal coating 233 applied to the inner wall of the first partial pipe 223a.

When a determination result in step S21 shows that the metal concentration of the treatment solution 91 is lower than the predetermined replenishment threshold and the determination result in step S22 shows that the temperature of the treatment solution 91 is appropriate, the control unit 100 checks whether the treatment solution 91 needs to be replenished from the collection tank 13 to the supply tank 12 (step S23). More specifically, the supply tank 12 and the collection tank 13 are provided with level sensors which measure a position of a liquid surface. When the amount of the treatment solution 91 in the supply tank 12 goes below a replenishment start amount, the amount of the treatment solution 91 in the collection tank 13 exceeds a replenishable amount, the treatment solution 91 is replenished (step S24). When determining that replenishment is necessary and replenishment is possible, the control unit 100 closes the valve 228 and opens the valve 250. Thus, the pump 225 guides the treatment solution 91 from the collection tank 13 to the supply tank 12. The amount of the treatment solution 91 replenished to the supply tank 12 is set in advance, for example.

As described above, the control unit 100 controls replenishment of the treatment solution from the collection tank 13 to the supply tank 12 based on at least the metal ion concentration obtained by the metal densitometer 226. Thus, the treatment solution 91 of the appropriate metal concentration is automatically replenished from the collection tank 13 to the supply tank 12. Furthermore, replenishment of the treatment solution from the collection tank 13 to the supply tank 12 is controlled also based on the temperature of the treatment solution 91, so that the temperature of the treatment solution 91 in the supply tank 12 is also prevented from rapidly lowering.

Furthermore, the particle removal filter 230 is disposed on the downstream side of the first partial pipe 223a in the second circulation path 223. Thus, even when particles are produced in the first partial pipe 223a, the particles are removed by the particle removal filter 230 immediately after, so that the particles are prevented from being diffused from the second flow path system 22 to the first flow path system 21.

In the first partial pipe 223a, the treatment solution 91 preferably flows at a low speed to efficiently capture the metal ions. On the other hand, the first circulation path 211 is connected to the supply path 212, and therefore the first circulation path 211 is demanded to provide a flow rate per unit time to some degree. Therefore, if metal removing means is provided in the first circulation path 211, it may be difficult to efficiently remove metal ions. By contrast with this, the substrate processing device 1 includes the metal removal coating 233 provided in the second circulation path 223, so that it is possible to reduce the flow rate of the treatment solution per unit time in the second circulation path 223 compared to the flow rate of the treatment solution per unit time in the first circulation path 211, and efficiently remove the metal ions. That is, compared to a case where the metal removing means is provided in the first circulation path 211, it is possible to easily reduce the flow velocity of the treatment solution 91 on the metal removal coating 233 by providing the metal removal coating 233 in the second circulation path 223.

Furthermore, the first circulation path 211 is located immediately before the supply path 212. Therefore, the temperature of the treatment solution 91 in the first circulation path 211 needs to be accurately adjusted. However, the temperature of the treatment solution 91 does not need to be accurately adjusted in the second circulation path 223 compared to the first circulation path 211. When the temperature of the treatment solution 91 is high, the temperature of the treatment solution 91 may affect measurement of the metal densitometer 226. Hence, in the substrate processing device 1, a setting temperature of the treatment solution 91 related to the heater 224 of the second circulation path 223 is lower than a setting temperature of the treatment solution 91 related to the heater 213 of the first circulation path 211. The setting temperature of the treatment solution is a target temperature set by the temperature adjustment unit including the heater, the thermometer, and the temperature control unit.

Long-term use of the metal removal coating 233 formed on the inner wall of the first partial pipe 223a eventually lowers capability for removing metal ions. As a result, the metal concentration measured in step S21 gradually rises. When the metal concentration exceeds the filter threshold (step S25), pipe cleaning processing is executed (step S26).

According to the pipe cleaning processing (step S26), the control unit 100 stops the operation of the substrate processing device 1, and discharges the treatment solution 91 in the device from the collection tank 13. Next, while the valve 227 is closed, the valve 244 is opened. Furthermore, the valve 228 maintains the opened state. While the valve 229 is closed, the valve 235 is opened. The pump 225 is turned OFF. In this state, the pump 243 is turned ON, and the acid-based chemical solution 92 in the chemical tank 241 is fed from the acid-based chemical solution supply path 242 to the first partial pipe 223a. The fed acid-based chemical solution 92 cleans the inner wall 223a1 of the first partial pipe 223a, and is discharged to the outside of the substrate processing device 1 via the branch pipe 234. By continuing this treatment for a predetermined period of time, a metal adsorption force of the metal removal coating 233 regenerates.

When the metal adsorption force is regenerated by using an acid-based chemical solution, if solution replacement efficiency is high, regeneration efficiency of a metal adsorption rate improves. As already described above with reference to FIG. 2, the substrate processing device 1 employs a simple configuration where the metal removal coating 233 polymerized with the metal capturing groups is applied to the inner wall of the first partial pipe 223a, so that it is possible to minimize blocking of a solution flow due to the metal removal coating 233 and secure high solution replacement efficiency. Hence, the pump 243 can feed the acid-based chemical solution 92 to the first partial pipe 223a at a relatively high flow velocity. As a result, it is possible to regenerate the metal adsorption force of the metal removal coating 233 in a short period of time.

Furthermore, the inner diameter of the first partial pipe 223a is substantially uniform. This contributes to minimization of the blocking of the solution flow due to the metal removal coating 233.

Figure 5:
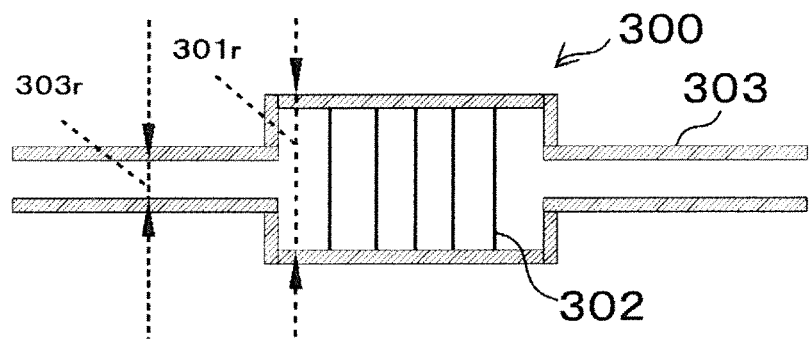
FIG. 5 shows a reference example where a metal removal sheet is stacked and disposed.

FIG. 5 shows a reference example of a metal removal filter. A metal removal filter 300 in FIG. 5 employs a configuration where a plurality of layers of metal removal sheets 302 are provided inside a pipe 301 such that a thickness direction of each of the metal removal sheets 302 intersects a flow direction of an acid-based chemical solution. An inner diameter 301r of the pipe 301 of a filter part is larger than an inner diameter 303r of a pipe 303 before and after the pipe 301.

Figure 6:
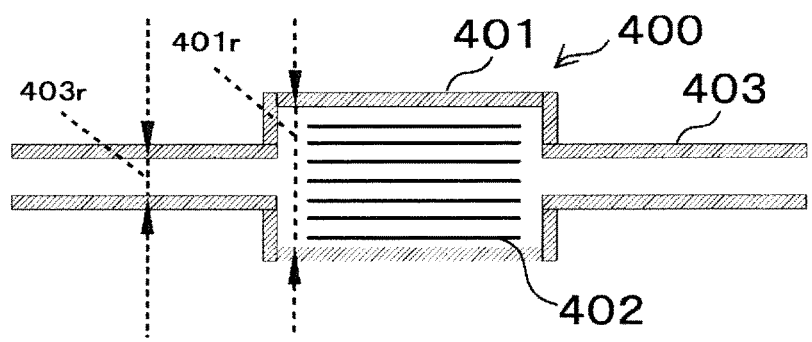
FIG. 6 shows a reference example where a metal removal sheet is stacked and disposed.

FIG. 6 shows another reference example of the metal removal filter. A metal removal filter 400 in FIG. 6 employs a configuration where a plurality of multiple layers of metal removal sheets 402 are provided inside a pipe 401 in parallel to a flow direction of a chemical solution. An inner diameter 401r of the pipe 401 of a filter part is larger than an inner diameter 303r of a pipe 403 before and after the pipe 401.

In each of the reference examples in FIGS. 5 and 6, the chemical solution flow is blocked by the sheets 302 and 402, and therefore when the chemical solution passes in the pipes 301 and 401, energy loss occurs and pressure loss is caused. Furthermore, a change in the inner diameter of the pipe also contributes to this pressure loss. Hence, in a case of the reference examples in FIGS. 5 and 6, the chemical solution cannot be fed into the pipe at a high flow velocity, and solution replacement efficiency lowers. As a result, regeneration of the metal adsorption force requires a long period of time. While the metal adsorption force is regenerated, the operation of the substrate processing device stops. That is, downtime becomes long.

Back to FIG. 4, when the regeneration of the metal removal coating 233 ends, the control unit 100 stops supplying the acid-based chemical solution 92, and unillustrated treatment solution supply means supplies the treatment solution 91 to the first partial pipe 223a to wash away the acid-based chemical solution 92 adhered to the first partial pipe 223a. Subsequently, the new treatment solution 91 is loaded to the supply tank 12 (step S27), and circulation and temperature adjustment of the treatment solution 91 start.

Figure 7:
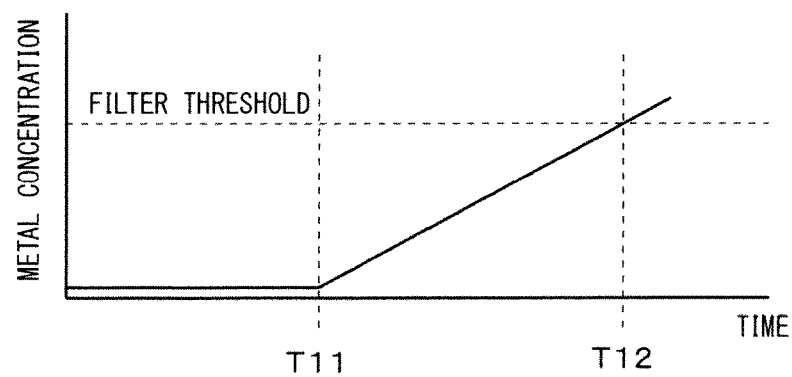
FIG. 7 shows an outline of a change in a metal concentration.

FIG. 7 shows an outline of the above change in the metal concentration which is a metal ion concentration. While removal capability of the metal removal coating 233 continues, the metal concentration measured by the metal densitometer 226 is low. Actually, every time the used treatment solution 91 flows from the processing unit 11 into the collection tank 13, the metal concentration fluctuates to some degree. When the metal removal coating 233 saturates at a time T11, and the metal ion removal capability lowers, the metal concentration gradually increases. When the metal concentration exceeds the filter threshold at a time T12, the pipe cleaning processing (step S26) is executed.

The substrate processing device 1 includes the metal removal coating 233 and further includes the metal densitometer 226, so that it is possible to increase and manage a lifetime of the treatment solution 91. As a result, it is possible to prevent an influence of deterioration of chemical solution characteristics such as etching selection ratio, and improve use efficiency of the treatment solution 91. In other words, it is possible to use costly treatment solution 91 while regenerating the treatment solution 91 without waste, and reduce manufacturing cost of the substrate 9.

As described above, the control unit 100 controls replenishment of the treatment solution from the collection tank 13 to the supply tank 12 based on at least the metal ion concentration obtained by the metal densitometer 226. Thus, the treatment solution 91 of the appropriate metal concentration is automatically replenished from the collection tank 13 to the supply tank 12. Furthermore, replenishment of the treatment solution from the collection tank 13 to the supply tank 12 is controlled also based on the temperature of the treatment solution 91, so that the temperature of the treatment solution 91 in the supply tank 12 is also prevented from rapidly lowering.

Furthermore, in the second circulation path 223, the particle removal filter 230 is disposed on the downstream side of the first partial pipe 223a whose inner wall has been applied the metal removal coating 233. Thus, even if particles are produced in the first partial pipe 223a, the particles are removed by the particle removal filter 230 immediately after, so that the particles are prevented from being diffused from the second flow path system 22 to the first flow path system 21.

In the first partial pipe 223a, the treatment solution 91 preferably flows at a low speed to efficiently capture the metal ions. On the other hand, the first circulation path 211 is connected to the supply path 212, and therefore the first circulation path 211 is demanded to provide a flow rate per unit time to some degree. Therefore, if means for removing metals is provided in the first circulation path 211, it may be difficult to efficiently remove metal ions. By contrast with this, the substrate processing device 1 includes the metal removal coating 233 provided in the second circulation path 223, so that it is possible to reduce the flow rate of the treatment solution per unit time in the second circulation path 223 compared to the flow rate of the treatment solution per unit time in the first circulation path 211, and efficiently remove the metal ions. That is, compared to a case where the metal removing means is provided in the first circulation path 211, it is possible to easily reduce the flow velocity of the treatment solution 91 in the first partial pipe 223a to which the metal removal coating 233 has been applied by providing the metal removal coating 233 to the second circulation path 223.

A necessary solution contact area of the metal removal coating 233 changes variously according to the metal concentration of the treatment solution 91 to be collected. The metal concentration of the treatment solution 91 to be collected depends on process contents, and therefore a user who frequently changes the process contents is requested to frequently change the solution contact area of the metal removal coating 233.

Consequently, the first partial pipe 223a may be formed by a plurality of unit pipes which can be coupled to each other. The necessary solution contact area is divided by a solution contact area per unit pipe to calculate the necessary number of unit pipes and to connect this number of unit pipes. Consequently, it is possible to easily create the first partial pipe 223a to which the metal removal coating of the necessary solution contact area has been applied.

Furthermore, the first circulation path 211 is located immediately before the supply path 212. Therefore, the temperature of the treatment solution 91 in the first circulation path 211 needs to be accurately adjusted. However, the temperature of the treatment solution 91 does not need to be accurately adjusted in the second circulation path 223 compared to the first circulation path 211. When the temperature of the treatment solution 91 is high, the temperature of the treatment solution 91 may affect measurement of the metal densitometer 226. Hence, in the substrate processing device 1, a setting temperature of the treatment solution 91 related to the heater 224 of the second circulation path 223 is lower than a setting temperature of the treatment solution 91 related to the heater 213 of the first circulation path 211. The setting temperature of the treatment solution is a target temperature set by the temperature adjustment unit including the heater, the thermometer, and the temperature control unit.

The substrate processing device 1 can be variously modified.

When the treatment solution 91 can be replenished from the collection tank 13 to the supply tank 12 by using the gravity, the replenishment path 222 without the pump may be provided between the collection tank 13 and the supply tank 12.

A temperature adjustment function of the second circulation path 223 may be omitted. In this case, after the treatment solution 91 is replenished to the supply tank 12, and while the treatment solution 91 is not supplied to the processing unit 11, temperature adjustment is performed until the temperature of the treatment solution 91 becomes appropriate in the supply tank 12 and the first circulation path 211. The replenishment of the treatment solution 91 from the collection tank 13 to the supply tank 12 may be performed by an operation of an operator. Supply of an acid-based chemical solution to the metal removal coating to regenerate the metal removal coating 233 may be also performed by the operation of the operator.

The pipe to which the metal removal coating 233 has been applied, and the metal densitometer 226 may be provided in the first flow path system 21. In this case, the first circulation path 211 is preferably provided with the metal removal coating 233 and the metal densitometer 226. In this case, the collection tank 13 may be omitted.

The pipe to which the metal removal coating 233 has been applied and the metal densitometer 226 may be provided at positions other than the second circulation path 223 of the second flow path system 22. In other words, the metal removal coating 233 and the metal densitometer 226 may be provided at various positions of the first flow path system 21 and the second flow path system 22. For example, the metal removal coating 233 may be applied to the inner wall of the collection tank 13. Even when the metal removal coating 233 is provided at any position, the particle removal filter 230 is preferably provided on the downstream of the metal removal coating 233.

The configurations of the above embodiment and each modified example may be combined as appropriate as long as the configurations do not contradict each other.

EXPLANATION OF REFERENCE SIGNS

1: substrate processing device
9: substrate
11: processing unit
12: supply tank
13: collection tank
21: first flow path system
22: second flow path system
91: treatment solution
92: acid-based chemical solution
100: control unit
211: first circulation path
213: heater
221: collection path
222: replenishment path
223: second circulation path (treatment solution circulation path)
223a: first partial pipe
223b: second partial pipe
224: heater
226: metal densitometer
230: particle removal filter
233: metal removal coating

The invention claimed is:

1. A substrate processing device comprising:
a supply tank which stores a treatment solution;
a processing unit which supplies the treatment solution in said supply tank to a substrate and performs etching processing on the substrate;
a collection path which guides the treatment solution supplied for said etching processing, to a collection tank;
a treatment solution circulation path which goes from said collection tank and returns to said collection tank; and
a pump which circulates the treatment solution in said collection tank via said treatment solution circulation path, wherein
the treatment solution circulation path has a pipe,
the pipe is applied a coating onto an inner wall thereof,
the coating including a metal capturing group which removes a metal ion in said treatment solution,
the metal capturing group including a material containing a chelate substituent, an ion exchange group or both of the chelate substituent and the ion exchange group,
the substrate processing device further comprising an acid-based chemical solution supply unit, the acid-based chemical solution supply unit which does not collect the used treatment solution from the processing unit and supplies an acid-based chemical solution through an acid-based chemical solution supply path to said pipe to which said coating has been applied, and removes the metal ion from said metal capturing group, the acid-based chemical solution supply unit being connected to said treatment solution circulation path.

2. The substrate processing device according to claim 1, wherein
a metal densitometer is interposed in said treatment solution circulation path, the substrate processing device further comprising a controller which, when a metal ion concentration in the treatment solution detected by said metal densitometer satisfies a preset condition, causes said acid-based chemical solution supply unit to supply the acid-based chemical solution into said pipe.

3. The substrate processing device according to claim 2, wherein said metal densitometer includes at least one of a spectrometer, a refractometer and a conductivity meter.

4. The substrate processing device according to claim 1, further comprising a particle removal filter on a downstream side of said coating in said treatment solution circulation path.

5. The substrate processing device according to claim 1, wherein said pipe whose inner wall has been applied said coating is formed by a combination of a plurality of unit pipes which are coupleable to each other.

6. The substrate processing device according to claim 1, wherein a branch pipe (234) is connected to a downstream end portion of the pipe.

* * * * *